United States Patent

Pan

(10) Patent No.: US 6,812,730 B2
(45) Date of Patent: Nov. 2, 2004

(54) METHOD FOR INDEPENDENT MEASUREMENT OF MOSFET SOURCE AND DRAIN RESISTANCES

(75) Inventor: James Pan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 68 days.

(21) Appl. No.: 10/388,081

(22) Filed: Mar. 13, 2003

(65) Prior Publication Data

US 2004/0178817 A1 Sep. 16, 2004

(51) Int. Cl.[7] .............................................. G01R 31/26
(52) U.S. Cl. ...................................... 324/769; 324/765
(58) Field of Search ............................... 324/765–769, 324/719, 691

(56) References Cited

U.S. PATENT DOCUMENTS

| | | | | |
|---|---|---|---|---|
| 5,519,336 A | * | 5/1996 | Liu et al. ..................... | 324/769 |
| 5,600,578 A | * | 2/1997 | Fang et al. .................... | 703/14 |
| 5,648,920 A | * | 7/1997 | Duvvury et al. .............. | 716/20 |
| 5,760,600 A | * | 6/1998 | Kasai .......................... | 324/769 |
| 6,073,082 A | * | 6/2000 | Maeda ......................... | 702/58 |
| 6,295,630 B1 | * | 9/2001 | Tamegaya ..................... | 716/4 |
| 6,646,462 B1 | * | 11/2003 | Yang et al. ................... | 324/769 |

* cited by examiner

Primary Examiner—David A. Zarneke
Assistant Examiner—Paresh Patel
(74) Attorney, Agent, or Firm—Foley & Lardner LLP

(57) ABSTRACT

The source resistance of a MOSFET is determined by grounding the source and applying a voltage to the substrate to force a current $I_{sub-S}$ through the source. The gate and drain are allowed to float while the current is forced. Since no current flows between the source and drain, a voltage $V_{DS}$ detected at the drain is the product of the forced current $I_{sub-S}$ and the source resistance $R_S$. Accordingly, the source resistance $R_S$ is determined to be the drain voltage $V_{DS}$ divided by the forced current $I_{sub-S}$. Drain resistance $R_D$ may be measured in an analogous manner.

16 Claims, 5 Drawing Sheets

METHOD FOR INDEPENDENT MEASUREMENT OF MOSFET SOURCE AND DRAIN RESISTANCES

BACKGROUND OF THE INVENTION

1. Field of the Invention

The present invention relates generally to fabrication of metal oxide semiconductor field effect transistors (MOSFETs), and, more particularly, to the measurement of MOSFET characteristics.

2. Related Technology

MOSFETs are a common component of integrated circuits (ICs). FIG. 1 shows a cross sectional view of a conventional MOSFET. The MOSFET is fabricated on a silicon substrate 10 within an active region bounded by shallow trench isolations 12 that electrically isolate the active region of the MOSFET from other IC components fabricated on the substrate 10.

The MOSFET is comprised of deep source and drain regions 14 having shallow source and drain regions 16 extending therefrom toward a channel region 18. The use of shallow source and drain extensions 16 rather than deep source and drain regions near the ends of the channel 18 helps to reduce short channel effects.

A gate 20 is separated from the channel region 18 by a thin gate insulator 22 such as silicon oxide or oxide-nitride-oxide (ONO). The gate is surrounded by first 24 and second 26 spacers that align the locations of the shallow source and drain extensions 16 and the deep source and drain regions 18 during their implantation.

Silicides 28, 30 are formed on the source and drain regions 14 and the gate 20 to provide ohmic contacts. The silicides typically comprise cobalt (Co) or nickel (Ni).

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. Due to quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 2. The MOSFET is fabricated on a substrate comprising a silicon germanium layer 32 grown on a silicon layer 10. An epitaxial layer of strained silicon 34 is grown on the silicon germanium layer 32. The MOSFET uses conventional MOSFET structures including deep source and drain regions 14, shallow source and drain extensions 16, a gate oxide layer 22, a gate 20 surrounded by spacers 24, 26, source and drain silicides 28, a gate silicide 30, and shallow trench isolations 12. The channel region of the MOSFET includes the strained silicon material, which provides enhanced carrier mobility between the source and drain.

The substrate in which a MOSFET is formed is lightly doped with a dopant of a first conductivity, and the source and drain regions of the MOSFET are heavily doped with a dopant of the opposite conductivity. For example, the substrate may be lightly doped with a p-type dopant, while the source and drain regions may be heavily doped with an n-type dopant. As a result, the channel region between the source and drain regions has very few n-type carriers, and there is effectively an open circuit between the source and drain regions. The gate of the MOSFET acts as a capacitor, such that when a gate voltage $V_{GS}$ of appropriate polarity is applied to the gate, carriers of the opposite conductivity are drawn from the substrate to create a thin "inversion layer" in the channel region. The presence of the inversion layer enables current flow between the source and drain. This type of MOSFET is referred to as an enhancement-only type MOSFET, since the application of voltage to the gate is only capable of enhancing the conductivity between the source and drain. The amount of current that can flow between the source and drain depends on the availability of carriers in the channel region, and therefore is controlled by the gate voltage $V_{GS}$. The minimum gate voltage $V_{GS}$ required to create an inversion layer in the channel is referred to as the threshold voltage $V_{GS(th)}$.

The use of heavily doped source and drain regions in an oppositely doped substrate creates depletion regions at the junctions of the source and drain regions with the oppositely doped substrate. The depletion regions provide electrical isolation of the MOSFET from other devices formed in the substrate.

MOSFETs are typically characterized by a set of drain curves as shown in FIG. 3. The drain curves of FIG. 3 show the effect on the drain current ID of changes in the source/drain voltage $V_{DS}$ for various gate voltages $V_{GS}$. As shown by the drain curves, the drain current ID increases in an approximately linear manner until a saturation point is reached and all available carriers are being used for conduction. Beyond the saturation point, further increases in source/drain voltage $V_{DS}$ produce negligible increases in drain current ID. The saturation current increases with increasing gate voltage $V_{GS}$ because an increase in gate voltage makes more carriers available in the inversion layer.

As MOSFETs become smaller, it becomes more important to accurately characterize the resistance of the source and drain regions. Conventionally, the source and drain resistances are not measured individually. Rather, the aggregate source and drain resistance $R_{DS}$ is extrapolated from the drain curves. As seen in FIG. 3, the aggregate source and drain resistance $R_{DS}$ is approximately represented by the slope of the pre-saturation portions of the drain curves. However, at small device dimensions, variations in the individual source and drain resistances can have pronounced effects on device performance, and it cannot be assumed that the source and drain resistances are equal. As a result, the conventional source/drain resistance measurement is inadequate because it does not determine individual values for the source and drain resistances.

SUMMARY OF THE INVENTION

Embodiments of the present invention pertain to a technique for measuring the individual source and drain resistances of a MOSFET.

In accordance with an embodiment of the invention, the source resistance is determined by grounding the source and applying a voltage to the substrate to force a current $I_{sub-S}$ through the source. If the gate and drain are allowed to float while current is forced through the source, no current flows between the source and drain, and as a result any voltage $V_{DS}$ detected at the drain is the product of the forced current $I_{sub-S}$ and the source resistance $R_S$. Accordingly, the source resistance $R_S$ is determined to be the drain voltage $V_{DS}$ divided by the forced current $I_{sub-S}$.

In accordance with one embodiment of the invention, the source or drain resistance of a MOSFET is measured individually. For purposes of this summary the measurement of source resistance will be described, however drain resistance may be measured by the same process. Initially the source is grounded while the gate and the drain are allowed to float. A current is then applied to the substrate in which the source and drain are formed. Voltage is measured at the drain while the current applied to the substrate flows through the source to ground. The resistance of the source is then determined from the current applied to the substrate and the voltage measured at the drain. Ideally several voltage measurements are made at several different currents, and the source resistance is determined to be an average of the resistances indicated by each of the individual measurements. The measurements should exclude any measurements made during a transient flyback condition. The current applied to the substrate during the measurements should be produced by application to the substrate of a voltage of sufficient magnitude to avoid creation of a transient flyback condition. The process in preferably automated.

DESCRIPTION OF THE DRAWINGS

Embodiments of the invention are described in conjunction with the following drawings, in which.

DETAILED DESCRIPTION OF PREFERRED EMBODIMENTS

Figure 1:
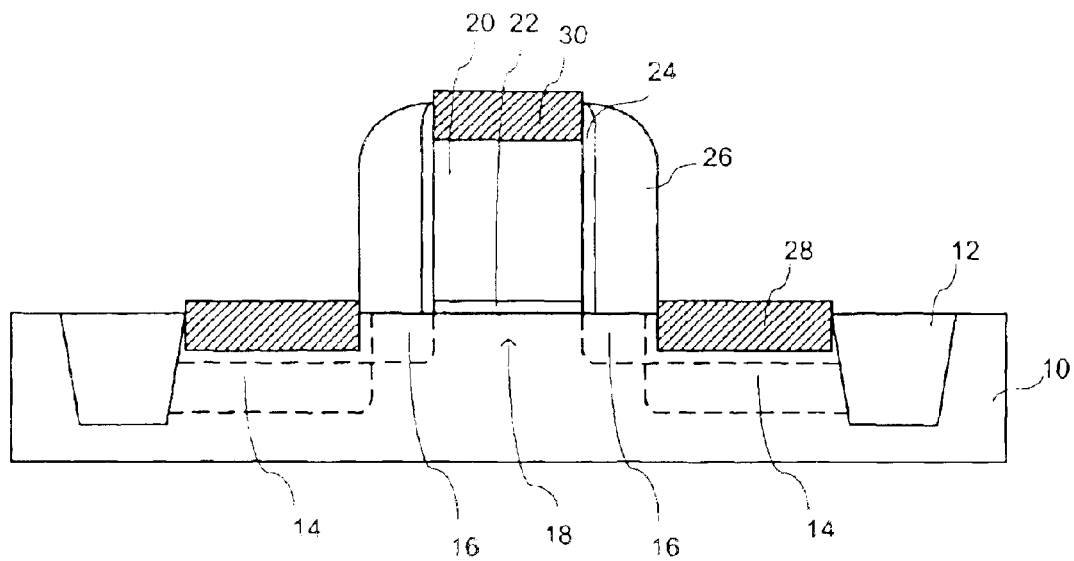
FIG. 1 shows a conventional MOSFET formed in accordance with conventional processing.
Figure 2:
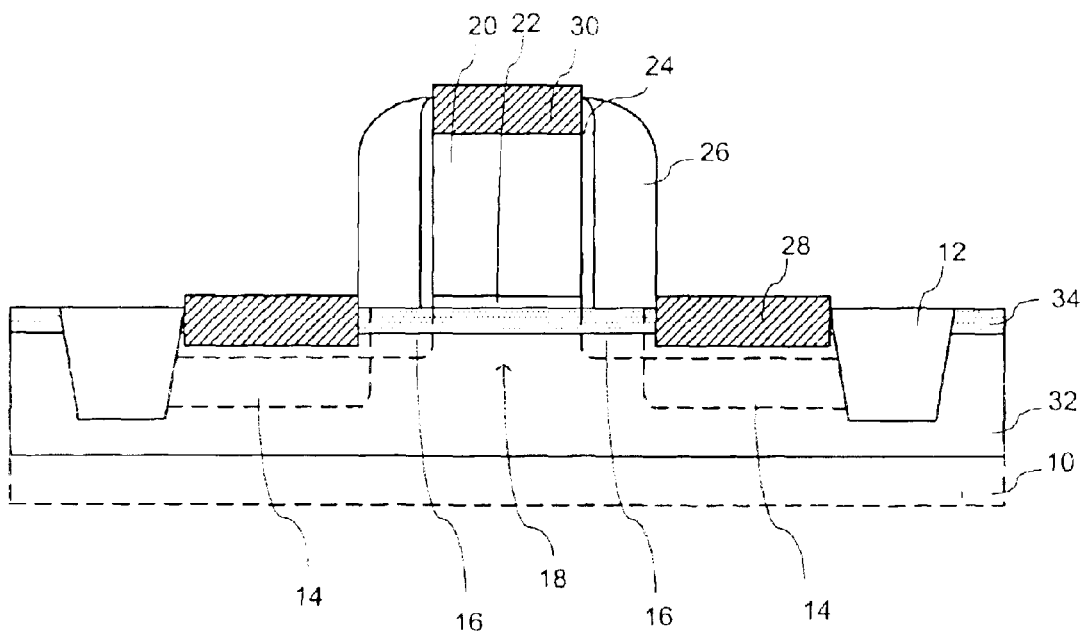
FIG. 2 shows a strained silicon MOSFET formed in accordance with processing similar to the conventional processing used to form the MOSFET of FIG. 1.
Figure 3:
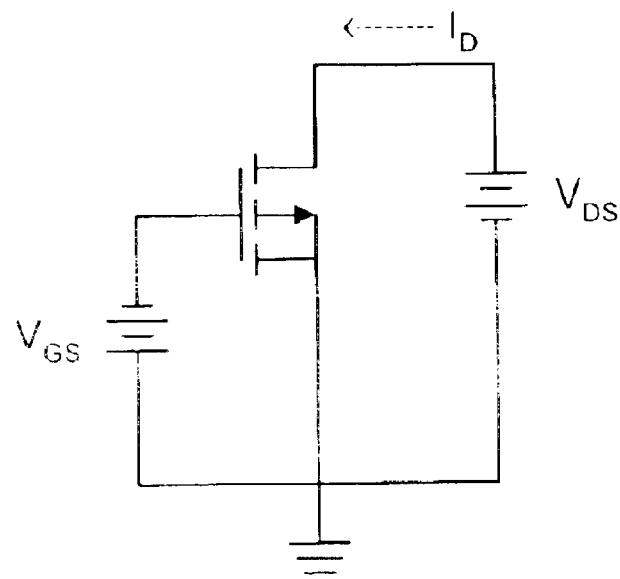
FIG. 3 shows the conventional manner for measuring the aggregate source and drain voltage of a MOSFET.
Figure 3:
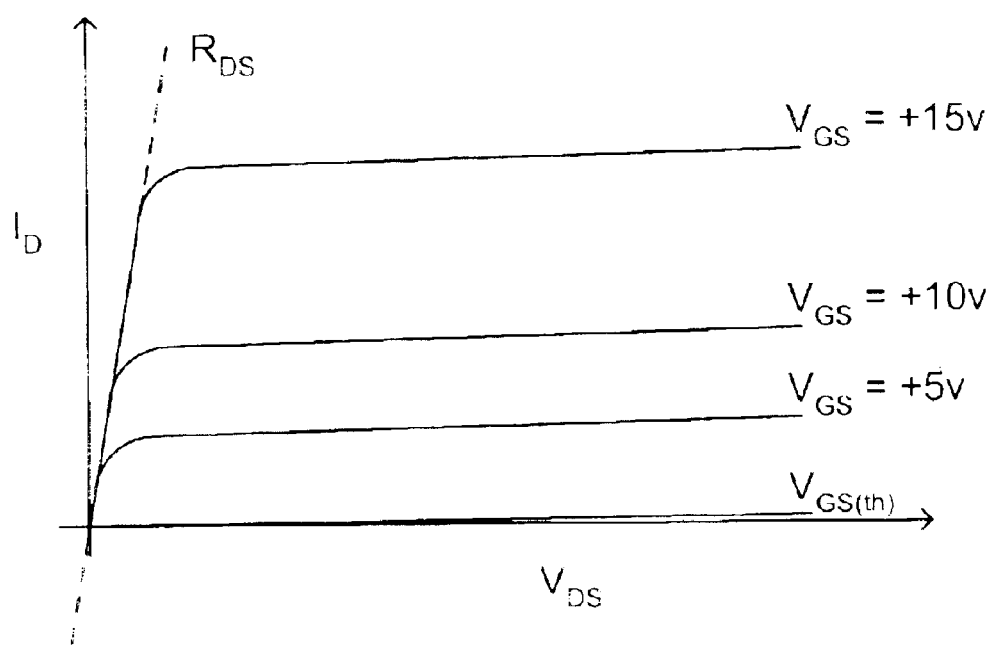
Figure 4:
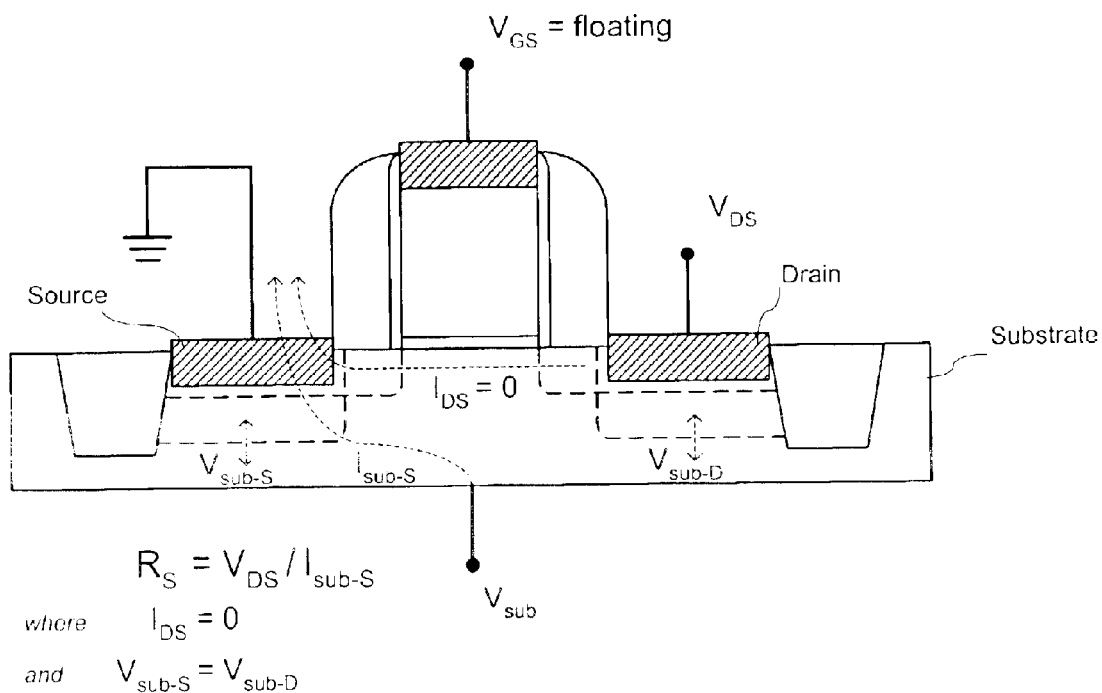
FIG. 4 shows a setup for individually measuring the resistance of the source region of a MOSFET in accordance with a preferred embodiment of the invention.
Figure 5:
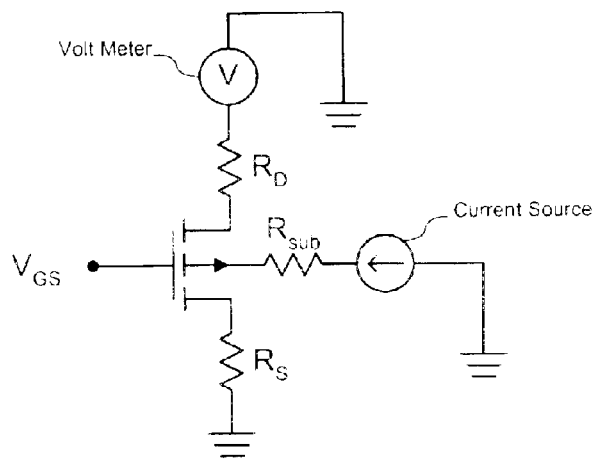
FIG. 5 shows a schematic representation of the structure of FIG. 4.

FIG. 4 shows a setup for individual measurement of the resistance of the source region of a MOSFET in accordance with a preferred embodiment of the invention, and FIG. 5 is a schematic representation of the structure of FIG. 4.

In the structure of FIG. 4, the source resistance is determined by grounding the source and forcing a current $I_{sub-S}$ through the substrate to the grounded source. The gate and drain are allowed to float while current is forced through the source, and as a result there is no current flow $I_{DS}$ between the source and drain. Consequently, any voltage $V_{DS}$ detected at the drain is the result of the passage of the forced current $I_{sub-S}$ through the source resistance $R_S$. In accordance with embodiments of the invention, the source resistance $R_S$ is determined to be the drain voltage $V_{DS}$ divided by the forced current $I_{sub-S}$.

Figure 6:
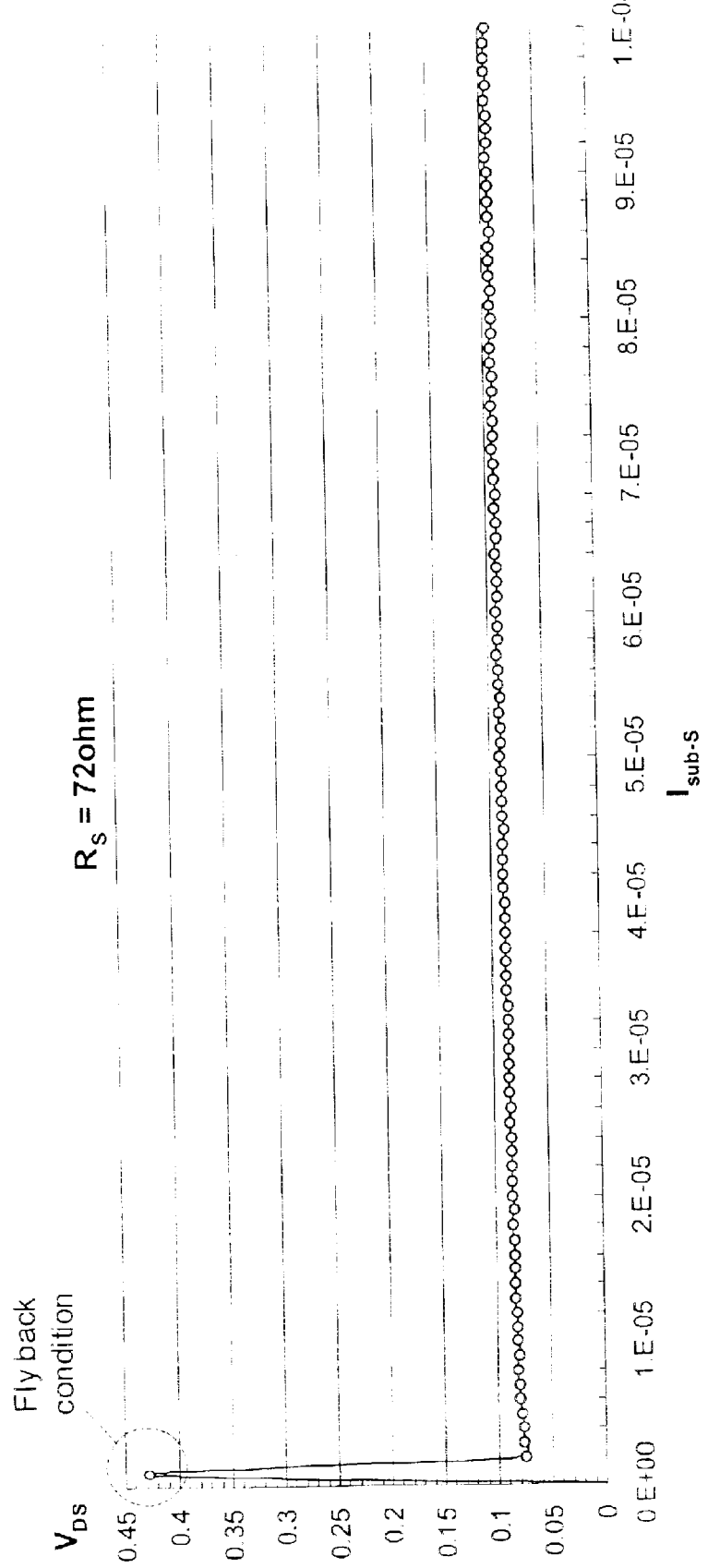
FIG. 6 shows a plot of drain voltage measurements and corresponding substrate current measurements for a structure of the type shown in FIG. 4.

In accordance with a preferred embodiment, several different current amplitudes are forced through the substrate to the grounded source, yielding a corresponding number of drain voltage $V_{DS}$ measurements. As shown in FIG. 6, the plurality of drain voltage measurements may be plotted against the corresponding forced substrate currents $I_{sub-S}$. This reveals an approximately linear relationship between the forced current and the drain voltage, with the slope of the line representing the source resistance $R_S$. In practice the respective drain voltage measurements $V_{DS}$ may be divided by their corresponding forced substrate currents $I_{sub-S}$, and the resulting quantities may then averaged to yield a source resistance measurement.

As seen in FIG. 6, transient conditions at low substrate currents may produce drain voltage readings that substantially exceed the range of the drain voltage measurements for higher substrate currents. This phenomena is referred to as "flyback" and is caused by small differences in the doping profiles of the source and drain regions. As described above, depletion regions are formed at the junctions of the source and drain regions with the substrate because of the opposite conductivities of their respective dopants. The junction voltages $V_{sub-S}$ and $V_{sub-D}$ at the respective junctions of the source and drain regions are slightly different as a result of the small differences in the dopand concentration and dopant distribution in each region. Before current is applied to the substrate, the source and drain junctions are both effectively reverse biased, and very little current flows so long as the voltage applied to the substrate is insufficient to overcome the junction voltages. As the applied current is increased, the source and drain junctions eventually become forward biased. However, each transition occurs at a slightly different time owing to slightly different doping, causing a transient flyback condition to arises in which only one of the junctions is forward biased. During the transient condition, the voltage detected at the drain is not representative of the source resistance. Therefore, source and drain resistance measurements in accordance with the invention should exclude measurements made during transient flyback conditions.

While the embodiment described above specifies that the source resistance is measured, the drain resistance may be measured in the same fashion by grounding the drain and measuring voltage at the source.

Further, the technique described above may be applied to both silicon and strained silicon MOSFETs, as well as MOSFETs formed using alternative substrate materials such as galium aresnide (GaAs).

The source resistance measurement process is preferably implemented in an automated fashion. For example, the process has been fully automated using an Eletro-Glass (HP4070/EG4090) high speed auto-prober, and has been semi-automated using an HP4156 I-V analyzer. The types of devices on which the process is automated are typically programmable devices that are be provided with programming for implementing the process tasks. Such programming may be stored in a computer readable medium, such as a RAM, ROM, hard disk or cd rom.

Figure 7:
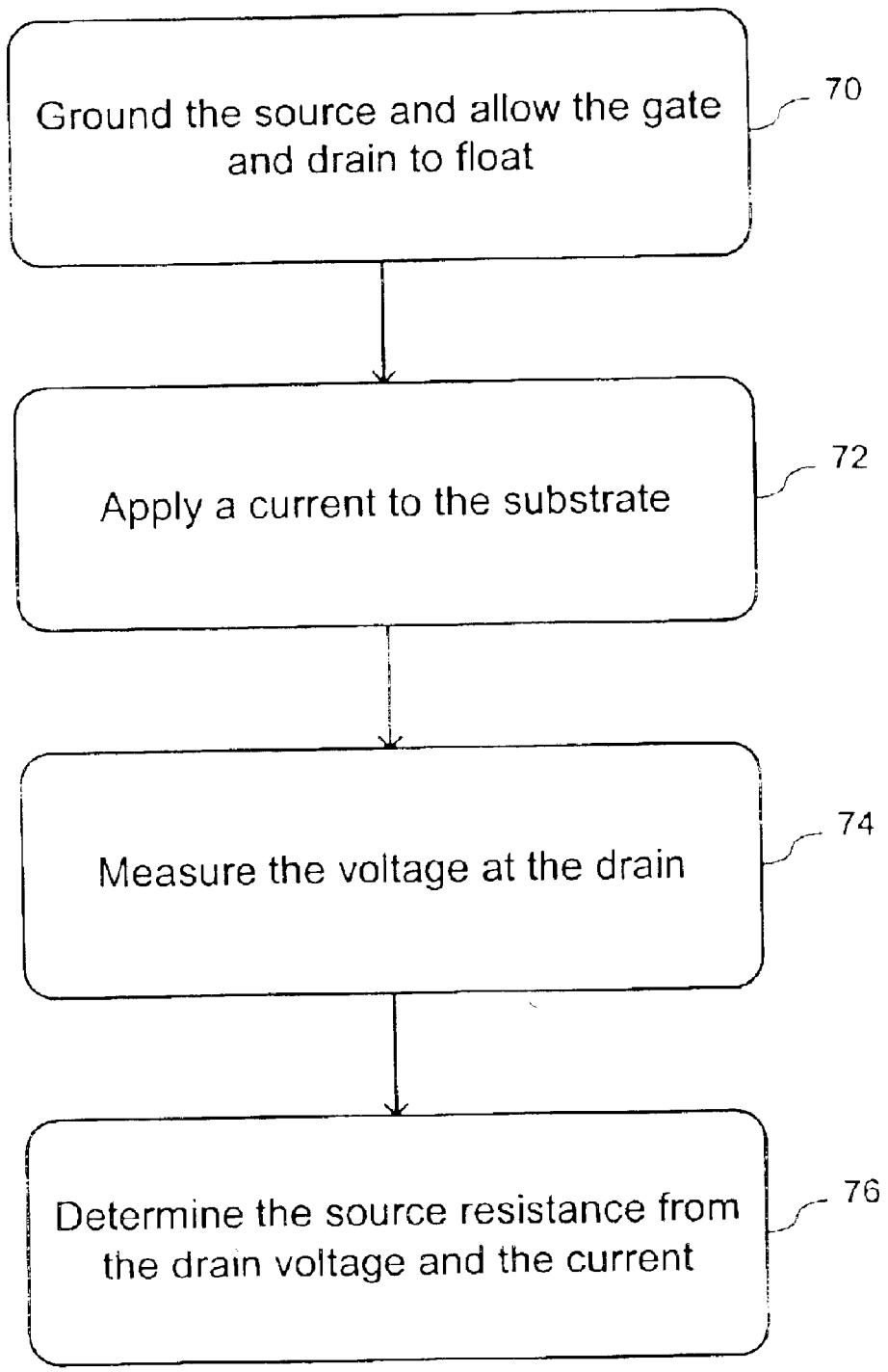
FIG. 7 shows a process flow encompassing preferred and alternative embodiments.

FIG. 7 shows a process flow for individually measuring the resistance of a source or drain region of a MOSFET in accordance with embodiments of the invention. For purposes of this process flow, the measurement of source resistance will be described, however drain resistance may be measured by the same process. Initially the source is grounded (70). The gate and the drain are allowed to float. A current is then applied to the substrate in which the source and drain are formed (72). Voltage is measured at the drain while the current applied to the substrate flows through the source to ground (74). The resistance of the source is then determined from the current applied to the substrate and the voltage measured at the drain (76). Ideally several voltage measurements are made using several different currents, and the source resistance is determined to be an average of the resistances indicated by each of the individual measurements. The measurements should exclude measurements made during a transient flyback condition. The current applied to the substrate to produce the voltage measurements that are used to determine the source resistance should be produced by application to the substrate of a voltage of sufficient magnitude to avoid creation of a transient flyback condition.

It will be apparent to those having ordinary skill in the art that the tasks described in the above processes are not necessarily exclusive of other tasks, but rather that further tasks may be incorporated into the above processes in accordance with the particular features to be implemented. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method for individually measuring the source or drain resistance of a MOSFET, comprising:
   grounding one of a source and a drain of the MOSFET, while allowing a gate of the MOSFET and the other of the source and the drain to float;
   applying a current to a substrate in which the source and drain are formed;
   measuring a voltage at the other of the source and drain while said current flows to ground through the grounded one of the source and drain; and
   determining the resistance of the grounded one of the source and drain from the current applied to the substrate and the voltage measured at the other of the source and drain.

2. The method claimed in claim 1, wherein a plurality of voltage measurements are made corresponding to a plurality of current amplitudes, and
   wherein said resistance is determined based on said plurality of voltage measurements and said corresponding plurality of current amplitudes.

3. The method claimed in claim 2, wherein the current used for said measurements is produced by application to the substrate of a voltage of sufficient magnitude to avoid creation of a transient flyback condition.

4. The method claimed in claim 2, wherein said measurements exclude voltage measurements made during a transient flyback condition.

5. The method claimed in claim 1, wherein the MOSFET is formed in a silicon substrate.

6. The method claimed in claim 1, wherein a channel region of the MOSFET comprises strained silicon.

7. The method claimed in claim 1, wherein the MOSFET is formed in a galium arsenide (GaAs) substrate.

8. The method claimed in claim 1, wherein the MOSFET is an enhancement-only type MOSFET.

9. A device for individually measuring the source or drain resistance of a MOSFET, the device including a computer readable medium storing programming code for causing the device to perform processing comprising:
   applying a current to a substrate in which a source and drain of a MOSFET are formed while grounding one of the source and the drain of the MOSFET and allowing a gate of the MOSFET and the other of the source and the drain to float;
   measuring a voltage at the other of the source and drain while said current flows to ground through the grounded one of the source and drain; and
   determining the resistance of the grounded one of the source and drain from the current applied to the substrate and the voltage measured at the other of the source and drain.

10. The device claimed in claim 9, wherein a plurality of voltage measurements are made corresponding to a plurality of current amplitudes, and
    wherein said resistance is determined based on said plurality of voltage measurements and said corresponding plurality of current amplitudes.

11. The device claimed in claim 10, wherein the current used for said measurements is produced by application to the substrate of a voltage of sufficient magnitude to avoid creation of a transient flyback condition.

12. The device claimed in claim 10, wherein said measurements exclude voltage measurements made during a transient flyback condition.

13. A computer readable medium storing programming code for causing a device to measure the source or drain resistance of a MOSFET by performing processing comprising:
    applying a current to a substrate in which a source and drain of a MOSFET are formed while grounding one of the source and the drain of the MOSFET and allowing a gate of the MOSFET and the other of the source and the drain to float;
    measuring a voltage at the other of the source and drain while said current flows to ground through the grounded one of the source and drain; and
    determining the resistance of the grounded one of the source and drain from the current applied to the substrate and the voltage measured at the other of the source and drain.

14. The computer readable medium claimed in claim 13, wherein a plurality of voltage measurements are made corresponding to a plurality of current amplitudes, and
    wherein said resistance is determined based on said plurality of voltage measurements and said corresponding plurality of current amplitudes.

15. The computer readable medium claimed in claim 14, wherein the current used for said measurements is produced by application to the substrate of a voltage of sufficient magnitude to avoid creation of a transient flyback condition.

16. The computer readable medium claimed in claim 14, wherein said measurements exclude voltage measurements made during a transient flyback condition.

* * * * *